(12) United States Patent
Saito

(10) Patent No.: US 8,106,378 B2
(45) Date of Patent: Jan. 31, 2012

(54) SEMICONDUCTOR QUANTUM DOT DEVICE

(75) Inventor: Hideaki Saito, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/640,226

(22) Filed: Dec. 18, 2006

(65) Prior Publication Data

US 2007/0215857 A1    Sep. 20, 2007

Related U.S. Application Data

(62) Division of application No. 10/482,966, filed on Jan. 7, 2004, now Pat. No. 7,189,986.

(30) Foreign Application Priority Data

Jul. 10, 2001  (JP) .................................. 2001-209208

(51) Int. Cl.
*H01L 29/06*    (2006.01)
*H01L 31/00*    (2006.01)

(52) U.S. Cl. ................ 257/14; 257/13; 257/90; 257/94; 257/183; 257/E29.071; 257/E29.073

(58) Field of Classification Search .................. 257/256, 257/263, E29.071

See application file for complete search history.

(56) References Cited

U.S. PATENT DOCUMENTS

| | | | |
|---|---|---|---|
| 5,192,709 A * | 3/1993 | Petroff | 438/508 |
| 5,371,379 A * | 12/1994 | Narusawa | 257/14 |
| 5,657,157 A * | 8/1997 | Lang et al. | 359/344 |
| 6,445,000 B1 * | 9/2002 | Masalkar et al. | 257/21 |
| 6,479,839 B2 * | 11/2002 | Nikolaev et al. | 257/82 |
| 6,586,762 B2 * | 7/2003 | Kozaki | 257/14 |
| 6,753,273 B2 * | 6/2004 | Holonyak et al. | 438/45 |
| 6,768,754 B1 * | 7/2004 | Fafard | 372/43.01 |
| 2004/0131097 A1 * | 7/2004 | Deppe et al. | 372/45 |

FOREIGN PATENT DOCUMENTS

| | | |
|---|---|---|
| JP | 62-188390 (A) | 8/1987 |
| JP | 63-206726 | 8/1988 |
| JP | 09-207508 | 8/1997 |
| JP | 09-270508 (A) | 10/1997 |
| JP | 10-261785 | 9/1998 |
| JP | 2000-22278 | 1/2000 |
| JP | 2000-188443 | 7/2000 |
| JP | 2001-308465 | 11/2001 |

OTHER PUBLICATIONS

D. Leonard, et al., Direct formation of quantum-sized dots from uniform coherent islands of InGaAs on GaAs surfaces, Applied Physics Letters, vol. 63, No. 23, pp. 3203-3205, Dec. 6, 1993.

(Continued)

*Primary Examiner* — Lynne Gurley
*Assistant Examiner* — Jesse Y Miyoshi
(74) *Attorney, Agent, or Firm* — McGinn IP Law Group, PLLC

(57) ABSTRACT

A p-type semiconductor barrier layer is provided in the vicinity of undoped quantum dots, and holes in the p-type semiconductor barrier layer are injected in advance in the ground level of the valence band of the quantum dots. Lowering the threshold electron density of conduction electrons in the ground level of the conduction band of quantum dots in this way accelerates the relaxation process of electrons from an excited level to the ground level in the conduction band.

15 Claims, 8 Drawing Sheets

OTHER PUBLICATIONS

G.T. Liu, et al., "Extremely low room-temperature threshould current density diode lasers using InAs dots in In0.15GA0.85As quantum well", Electronics Letters, vol. 35, No. 14, pp. 1163-1165, Jul. 8, 1999.

H. Chen, et al., "InAs quantum-dot lasers operating near 1.3um with high characteristic temperature for continious-wave operation", Electronics Letters, vol. 36, No. 20, pp. 1703-1704, Sep. 28, 2000.

Kazuhisa Uomi, "Modulation-Doped Multi-Quantum Well (MD-MQW) Lasers. I. Theory", Japanese Journal of Applied Physics, vol. 29, No. 1, pp. 81-87, Jan. 1999.

Japanese Office Action dated Sep. 14, 2010 with an English Translation.

Japanese Office Action dated Jul. 25, 2011 with an English Translation.

* cited by examiner

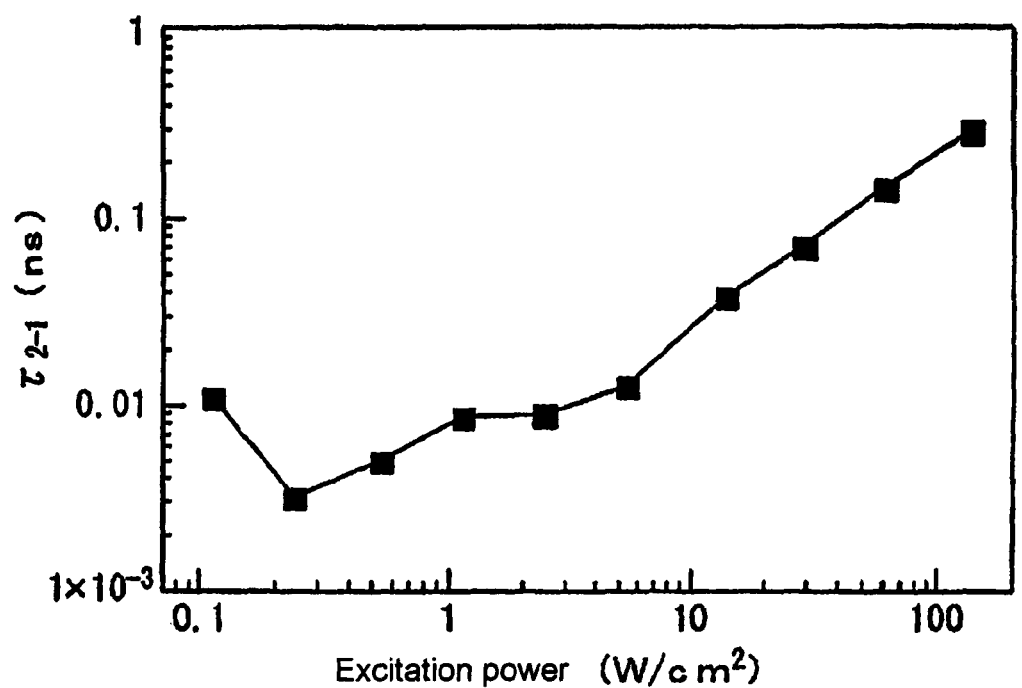

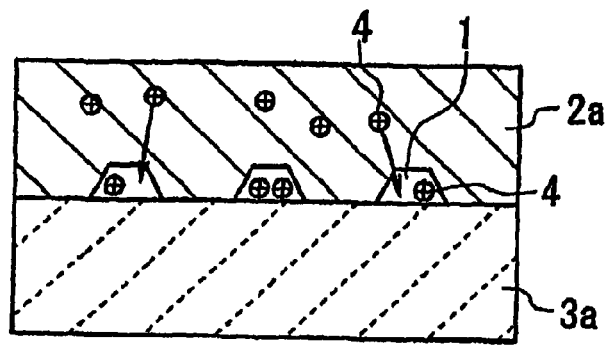
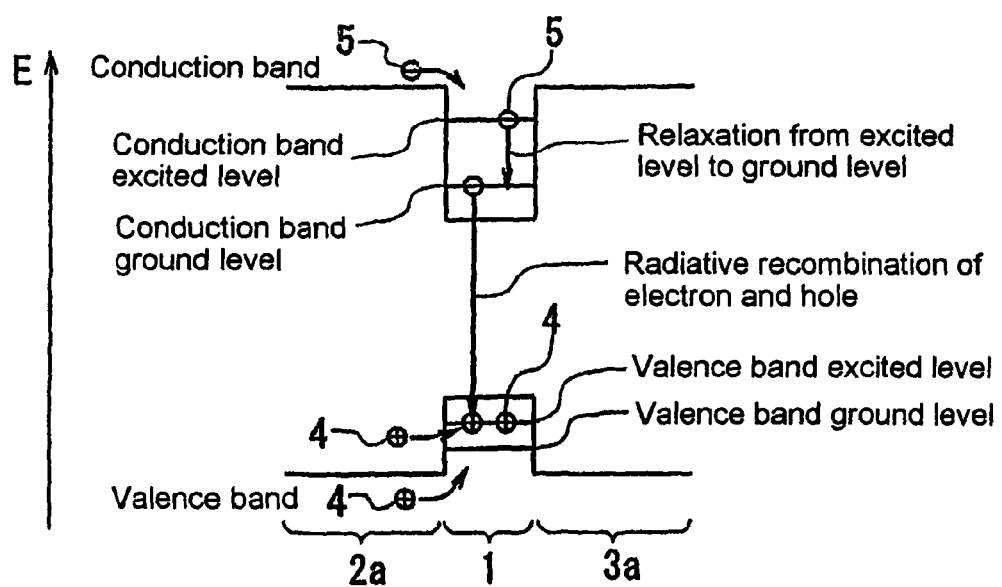

SEMICONDUCTOR QUANTUM DOT DEVICE

The present application is a Divisional Application of U.S. patent application Ser. No. 10/482,966, filed on Jan. 7, 2004 now U.S. Pat. No. 7,189,986.

TECHNICAL FIELD

The present invention relates to electronic devices such as field effect transistors and single-electron elements as well as to semiconductor optical devices such as semiconductor lasers, semiconductor amplifiers, semiconductor optical switches, wavelength conversion elements, and optical memories which are used in, for example, optical communication and optical interconnections; and more particularly to a semiconductor quantum dot device which is provided with quantum dots.

BACKGROUND ART

Quantum dots can be called boxes of quantized potential on the hyperfine scale in which carriers (conduction electrons and holes) are confined in three dimensions. The density of the state function of carriers in a quantum dot is broken up according to a delta function, and the injected carriers are concentrated in these discrete energy levels. As a result, light which is emitted when the conduction electrons and holes recombine in the interior of quantum dots is of high optical intensity, and moreover, the width of the spectrum is extremely narrow.

In a semiconductor laser in which quantum dots having these properties are provided in an active layer, the reduced threshold current which is required for laser oscillation and the decrease in carriers results in reduced internal loss, and therefore, improved oscillation efficiency. In addition, the marked change in gain peak with respect to change in the carrier density enables high-speed operation. (A semiconductor laser in which quantum dots are applied in the active layer is hereinbelow referred to as a "quantum dot laser.")

The realization of a quantum dot laser having these superior properties requires that quantum dots be formed at high density and with high uniformity, and moreover, without degrading crystallinity. Methods that are known from the prior art for forming such quantum dots include methods which employ such techniques as lithography and dry etching. However, these methods have the drawback that processing damage which occurs in the semiconductor crystal as a result of lithography or dry etching greatly reduces the light emission efficiency.

As a method of eliminating this problem, a "Direct formation method (or Self-organizing method)" has been developed and put into actual use in recent years. In this method, quantum dots are formed merely by growing crystals.

The direct formation method was reported by D. Leonard et al. in 1993. This method was proposed based on the finding that when a lattice-misfit InGaAs is grown on a GaAs substrate, the InGaAs grows as a layer until it exceeds a critical film thickness, and upon exceeding the critical film thickness, grows as islands, these island InGaAs crystals having a size of several tens of nanometers. This size is suitable for quantum dots [D. Leonard et al., Applied Physics Letters, Vol. 63, No. 23, pp. 3203-3205, December 1993]. The direct formation method was subsequently confirmed to be an excellent method for forming quantum dots.

The application of quantum dots formed by the direct formation method to semiconductor lasers is currently being widely studied. For example, G. T. Liu et al. have demonstrated that a quantum dot laser fabricated using the direct formation method operates with a lower injected current density than a prior-art semiconductor laser having an active layer of a bulk structure or quantum well structure [G. T. Liu et al., Electronics Letters, Vol. 35, No. 14, pp. 1163-1165, Jul. 8, 1999].

Further, Chen has demonstrated that the operating current of a quantum dot laser which has been fabricated using the direct formation method is not influenced by temperature [H. Chen et al., Electronics Letters, Vol. 36, No. 20, pp. 1703-1704, Sep. 28, 2000].

However, a quantum dot laser which has an operating speed surpassing that of a semiconductor laser of the prior art having an active layer of bulk structure or quantum well structure has not yet been proposed. This is due to problems described hereinbelow that are inherent to quantum dots.

According to the Pauli exclusion principal, only two conduction electrons and two holes can exist in each of the lowest energy levels (ground levels) of the conduction band and valence band in a quantum dot which has been quantized in three dimensions. As a result, if the ground levels of the conduction band and valence band are already occupied by conduction electrons and holes (carriers), additional conduction electrons or holes cannot be injected in the ground level. The transition of conduction electrons and holes from excited levels to the ground levels of the conduction band and valence band is referred to as "relaxation."

Accordingly, in a quantum dot laser which is oscillated by the injection of a multiplicity of carriers into a plurality of quantum dots formed in an active layer, the relaxation rate of electrons which transition from excited levels of the conduction band (an energy level which is higher than the ground level of the conduction band) to the ground level steadily drops with increase in the number of injected conduction electrons. On the other hand, the relaxation rate of holes which transition from an excited level of the valence band (an energy level which is lower than the ground level of the valence band) to the ground level drops steadily with increase in the number of holes that are injected.

FIG. 1 is a graph showing the emission (photoluminescence, PL) spectrum of a semiconductor sample in which a plurality of InAs quantum dots are formed on a GaAs substrate. The emission spectrum shown in FIG. 1 shows the results of measuring light which is emitted when excitation light is irradiated onto the sample to cause the generation of carriers inside the sample and the recombination of these generated carriers inside the InAs quantum dots. In addition, FIG. 2 is a graph showing the relation between the excitation power and the ratio ($I_2/I_1$) of emission intensity $I_1$ from the ground level to emission intensity $I_2$ from the excited level of the quantum dots for the sample that produced the emission spectrum of FIG. 1.

As can be understood from FIG. 1 and FIG. 2, as the excitation power increases, emission intensity $I_1$ from the ground level first increases and gradually approaches saturation, following which emission intensity $I_2$ from the excited level increases. The excited level emission intensity $I_2$ begins to gradually increase before the emission intensity $I_1$ from the ground level reaches complete saturation.

Here, if the thermal excitation of carriers to excited levels is considered, the change over time in the number of carriers at an excited level can be given by the following equation (1):

$$\frac{\partial N_1}{\partial t} = \frac{N_2}{\tau_{r2}} - \frac{N_1}{\tau_{r2}} - \frac{\frac{N_1}{\tau_{2-1}}}{\exp\left(-\frac{\Delta E_{2-1}}{kT}\right)} \quad (1)$$

In equation (1), $N_1$ and $N_2$ represent the number of carriers at the ground level and excited level, respectively; $\tau_{r1}$ and $\tau_{r2}$ represent the radiative recombination times of the ground level and excited level, respectively; $\tau_{2-1}$ is the relaxation time of carriers from the excited level to the ground level; $\Delta E_{2-1}$ represents the energy difference between the excited level and the ground level; k is the Boltzmann constant; and T is the absolute temperature.

In a stationary state, the left side of equation (1) is "0" and the ratio ($I_2/I_1$) of excited level emission intensity $I_2$ to ground level emission intensity $I_1$ can therefore be shown by equation (2) below:

$$\frac{I_2}{I_1} = \frac{\frac{N_2}{\tau_{r2}}}{\frac{N_1}{\tau_{r1}}} = \frac{\tau_{2-1} + \tau_{r1}\exp\left(-\frac{\Delta E_{2-1}}{kT}\right)}{\tau_{r2}} \quad (2)$$

As can be understood from equation (2), emission intensity ratio ($I_2/I_1$) is a function of the absolute temperature T.

In the above-described semiconductor sample (in which InAs quantum dots are formed on a GaAs substrate), if $\Delta E_{2-1}$ is assumed to be 73 meV, $\tau_{r1}$ to be 0.7 ns and $\tau_{r2}$ to be 0.5 ns at room temperature (293 K), the relation of the excitation power to relaxation time $\tau_{2-1}$ of carriers, which is found from the change in the emission intensity ratio ($I_2/I_1$) shown in FIG. 2 is as shown in FIG. 3.

As can be understood from FIG. 3, as the excitation power increases, the relaxation time $\tau_{2-1}$ of the carriers gradually increases due to filling of carriers at the ground level and thus approaches the radiative recombination times $\tau_{r1}$ and $\tau_{r2}$ (approximately 1 ns) of the ground level and excited level.

Thus, when the excitation power is 100 W/cm$^2$, i.e., when the same carrier density can be obtained as during laser oscillation, the carrier relaxation time $\tau_{2-1}$ becomes 0.2 ns at room temperature (293 K). In this case, the 3-dB modulation bandwidth $f_{3dB}$ given by the following equation (3) is 0.8 GHz. In other words, the 3-dB modulation band $f_{3dB}$, which is the frequency range in which direct modulation is possible, is limited to 0.8 GHz.

$$f_{3dB} = \frac{1}{2\pi\tau_{2-1}} \quad (3)$$

As is obvious from the foregoing explanation, the modulation rate in a quantum dot device such as a quantum dot laser drops due to decrease in the relaxation rate of carriers (increase in carrier relaxation time $\tau_{2-1}$), and this limited modulation rate complicates the realization of a modulation bandwidth on the order of 10 GHz, which is required in a current optical communication system.

The present invention was developed to overcome the above-described problems inherent to the prior art and has as an object the provision of a quantum dot device which, by accelerating the relaxation of carriers to the ground level in quantum dots, can realize a broad modulation band of at least approximately 10 GHz and high-speed operation.

DISCLOSURE OF THE INVENTION

The quantum dot device of the present invention is a construction in which a p-type impurity is injected into quantum dots, whereby this p-type impurity causes the generation of holes inside the quantum dots, these holes being at the ground level of the valence band of the quantum dots. In such a construction, the relaxation of carriers (carrier injection) from an excited level to the ground level is accelerated, and increase in the relaxation time of the carriers is therefore suppressed. As a result, the modulation band of the quantum dot device can be extended and a broad modulation band on the order of 10 GHz or more and an operating speed on the order of 10 GHz or higher can be realized.

In the present invention, the following relation is satisfied in the above-described quantum dot device:

$$X_2 \geq X_1,$$

where $X_1$ (cm$^{-2}$) is the surface density of the quantum dots and $X_2$ (cm$^{-2}$) is the surface density of the p-type impurity contained in the quantum dots.

As a result, relaxation process of electrons from the excited level to the ground level is accelerated in the conduction band of the quantum dot.

Furthermore, if the following relation is satisfied:

$$X_2 \geq 2 \times X_1,$$

the relaxation of carriers (carrier injection) to the ground level is remarkably accelerated since substantially all the ground levels of the valence band of the quantum dots are occupied by holes.

In addition, when the absorption loss by the hole excessively doped to the ground level of the valence band is considered, it is preferable to satisfy the following relation:

$$X_2 \approx 2 \times X_1.$$

Further, the quantum dot device of the present invention is a construction in which a p-type impurity region is formed in the vicinity of a quantum dots, whereby holes generated in the p-type impurity region are introduced into the quantum dots, these holes being at the ground level of the valence band of the quantum dots. Here, the "vicinity" of the quantum dot includes cases in which the p-type impurity region is formed in contact with the quantum dot and cases in which the p-type impurity region is formed separated by a distance within which the injection efficiency of the holes does not drop excessively, such as a distance of 10 nm or less.

In such a construction as well, the relaxation of the carriers (carrier injection) from an excited level to the ground level is accelerated, and increases in the relaxation time of the carriers can therefore be suppressed. As a result, the modulation band of the quantum dot device can be extended and a broad modulation band on the order of 10 GHz or more and an operating speed on the order of 10 GHz or higher can be realized.

In the present invention, the following relation is satisfied in the above-described quantum dot device:

$$X_2 \geq X_1,$$

where $X_1$ is the surface density of the quantum dots and $X_2$ is the surface density of the p-type impurity contained in the p-type impurity region.

As a result, relaxation process of electrons from the excited level to the ground level is accelerated in the conduction band of the quantum dot.

Furthermore, if the following relation is satisfied:

$$X_2 \geq 2 \times X_1,$$

the relaxation of carriers (carrier injection) to the ground level is remarkably accelerated since substantially all the ground levels of the valence band of the quantum dots are occupied by holes.

In addition, when the absorption loss by the hole excessively doped to the ground level of the valence band is considered, it is preferable to satisfy the following relation:

$$X_2 \approx 2 \times X_1.$$

BRIEF DESCRIPTION OF THE DRAWINGS

FIG. 3 is a graph showing the relation between the excitation power and the relaxation time $\tau_{2\text{-}1}$ of carriers from an excited level to the ground level for the sample in which the emission spectrum of FIG. 1 is obtained;

FIG. 7A is a sectional view showing the construction of the second embodiment of the semiconductor quantum dot device of the present invention;

FIG. 7B is an energy band diagram of the semiconductor quantum dot device shown in FIG. 7A;

BEST MODE FOR CARRYING OUT THE INVENTION

The present invention is next described with reference to the accompanying drawings.

First Embodiment

Figure 1:
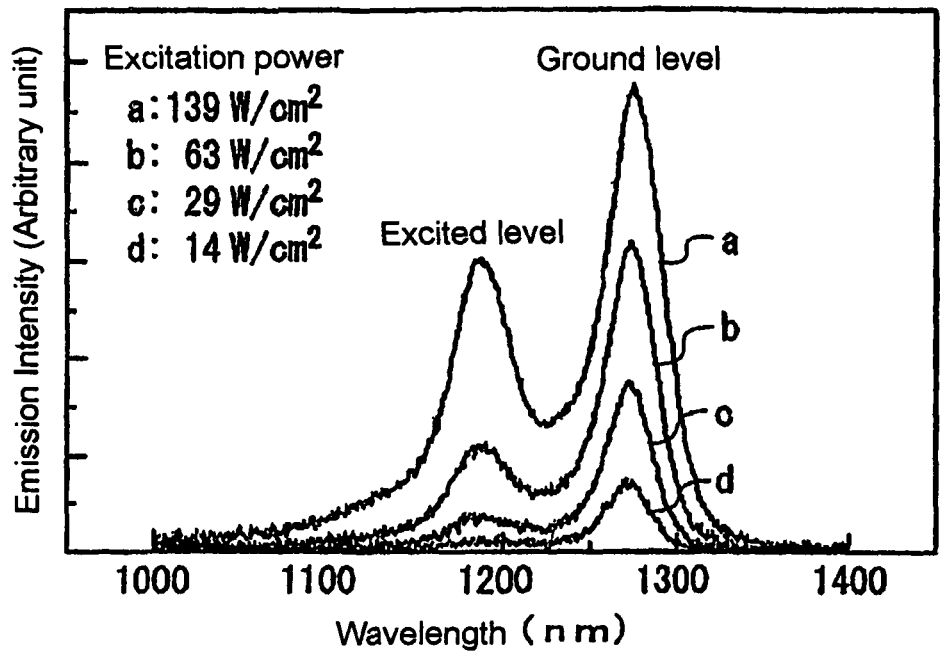
FIG. 1 is a graph showing the emission photoluminescence spectrum of a semiconductor sample in which a plurality of InAs quantum dots have been formed on a GaAs substrate.
Figure 2:
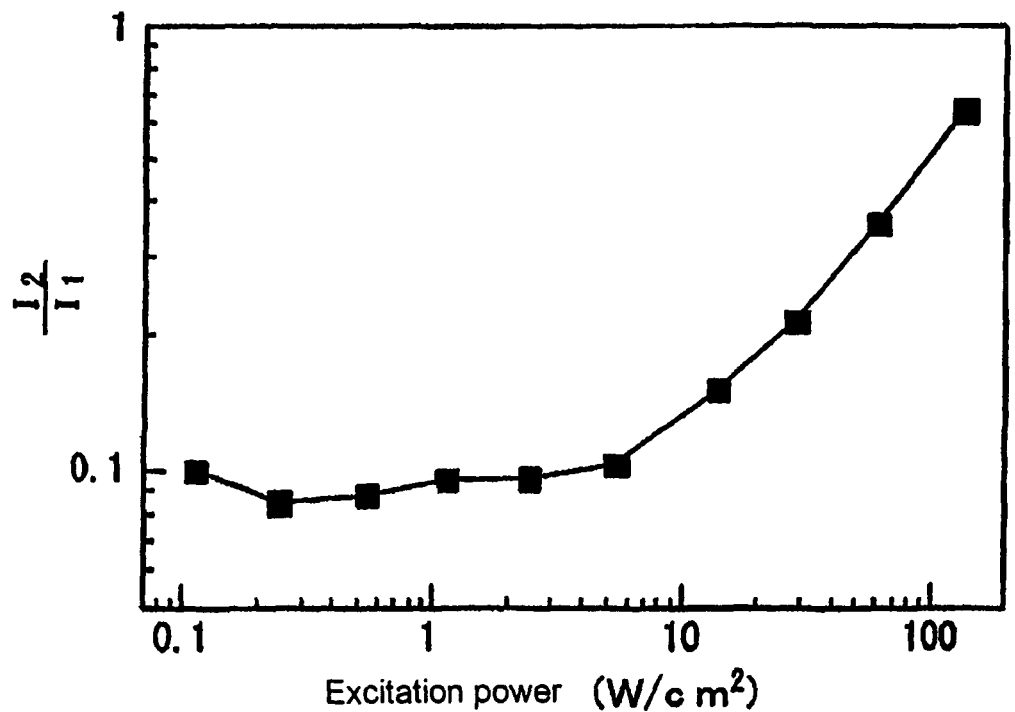
FIG. 2 is a graph showing the relation between the excitation power and ratio ($I_2/I_1$) of emission intensity $I_2$ from the excited level and emission intensity $I_1$ from the ground level of the quantum dots for the sample in which the emission spectrum of FIG. 1 is obtained.
Figure 4A:
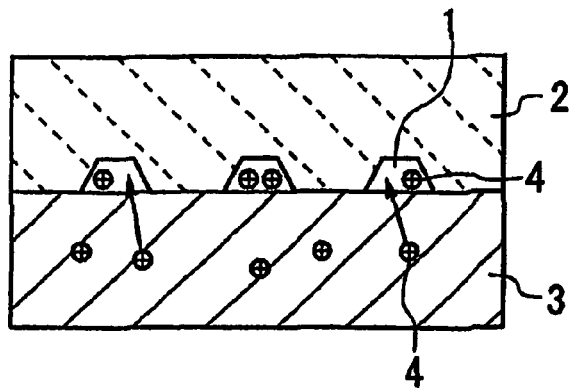
FIG. 4A is a sectional view showing the construction of the first embodiment of the semiconductor quantum dot device of the present invention.

As shown in FIG. 4A, the semiconductor quantum dot device according to the first embodiment is a construction in which a plurality of quantum dots 1 which have been formed from an undoped semiconductor are disposed on the surface of p-type semiconductor barrier layer 3 at a surface density of, for example, $5 \times 10$ cm$^{-2}$.

Figure 4B:
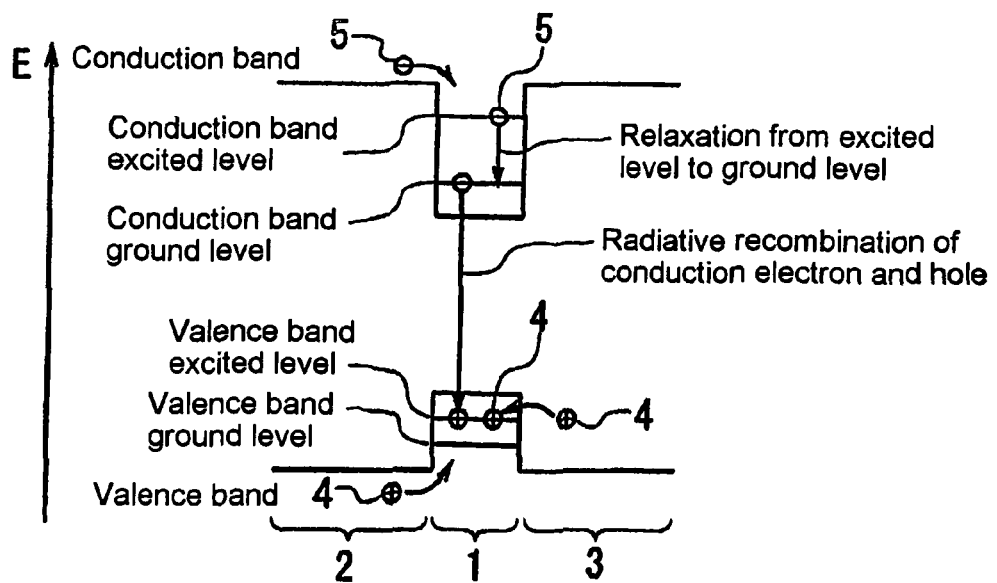
FIG. 4B is an energy band diagram of the semiconductor quantum dot device shown in FIG. 4A.

P-type impurity is injected into p-type semiconductor barrier layer 3, whereby a multiplicity of holes 4 exist in the interior of p-type semiconductor barrier layer 3. A portion of these holes 4 are introduced into adjacent quantum dots 1. In other words, this is a construction in which quantum dots 1 shown in FIG. 4A contain holes 4 even though these quantum dots 1 are not injected with p-type impurity (i.e., the quantum dots are undoped). As shown in FIG. 4B, these holes 4 are in the ground level of the valence band of quantum dots 1, and the ground level of the valence band is therefore filled by holes 4. In addition, quantum dots 1 are covered by undoped semiconductor barrier layer 2 formed over quantum dots 1.

As described in the foregoing explanation, the ground level of the valence band of quantum dots 1 includes a number of states of two if the spin is taken into consideration. The amount of p-type impurity injected into p-type semiconductor barrier layer 3 is therefore set to generate holes at a surface density of $1 \times 10^{11}$ cm$^{-2}$ ($= 5 \times 10^{10}$ cm$^{-2} \times 2$).

In the present embodiment, holes 4 are introduced into quantum dots 1 in advance and the presence of these holes 4 in the ground levels of the valence band of quantum dots 1 accelerates the process of relaxation of conduction electrons 5 from excited levels to the ground levels of the conduction band of quantum dots 1. In other words, the relaxation time of conduction electrons 5 of quantum dots 1 is reduced.

It should be noted that the "radiative recombination of holes and conduction electrons" shown in FIG. 4B means the process in which conduction electrons 5 transition from the ground level of the conduction band to the ground level of the valence band of quantum dots 1, recombine with holes 4 which are at the ground level of the valence band, and thus emit light.

The reason for the acceleration of the relaxation process of conduction electrons 5 from an excited level to the ground level of the conduction band of quantum dots 1 is explained hereinbelow. The following explanation regards a case in which the quantum dot device of the present embodiment is applied to a semiconductor laser, but the explanation also holds true when the quantum dot device of the present invention is applied to other optical devices.

Typically, when directly modulating a semiconductor laser, the injected carriers, i.e., the injected current, are increased or decreased in accordance with modulation signals while the semiconductor laser is subjected to laser oscillation. Since the threshold value of the carrier density of the active layer (the threshold carrier density) is constant during laser oscillation, the intensity of emitted light varies in accordance with the increase and decrease of the carrier.

In the case of a quantum dot laser which includes a quantum dot structure in the active layer, however, the threshold carrier density of the ground level of the quantum dots should be reduced to a minimum and the relaxation process of the carrier to the ground level should be accelerated in order to improve the operating (modulation) speed.

As shown in FIG. 4B, in quantum dot 1, conduction electrons 5 in the conduction band are injected in the ground level of the conduction band, and holes 4 of the valence band are injected in the ground level of the valence band. Since the effective mass of hole 4 is greater by one decimal place than the effective mass of conduction electron 5, the energy difference between the ground level and the excited level of the valence band is extremely small and holes 4 are easier to relax than conduction electrons 5. In other words, holes 4, which have greater effective mass, have properties which are easier to restrain in a quantum level such as the ground level or excited level than electrons, which have less effective mass. It can be seen that the difficulty of relaxing conduction electrons 5, which have smaller effective mass, is the governing factor which limits the high-speed modulation of the semiconductor laser.

Therefore, the time necessary for the relaxation process of conduction electrons 5 from an excited level to the ground level of the conduction band (i.e., the relaxation time) should be shortened as much as possible to the realize high-speed modulation characteristics of a quantum dot laser.

However, when the density of states (number of states) of conduction electrons 5 or holes 4 in quantum dots 1 is approximated using a Gaussian function having an uneven spread $\Delta E$ from center energy $E_0$, gain g (the gain of only the ground level) of an active layer having a quantum dot structure is as shown in equation (4):

$$g = \frac{h^3 c^2 N}{2\pi n^2 E_0^2 \tau_{sp} \Delta E} \sqrt{\frac{\ln 2}{\pi}} \, [f_c + (1-f_v) - 1] \quad (4)$$

In equation (4), h is the Planck's constant, c is the speed of light, N is the surface density of quantum dots 1, n is the index of refraction, $\tau_{sp}$ is the lifetime of spontaneous emission light, $f_c$ is the occupation probability of conduction electrons 5 in the conduction band, and $f_v$ is the occupation probability of conduction electrons in the valence band. In addition, $f_c$ and $f_v$ are values such that $0 \leq f_c \leq 1$, $0 \leq f_v \leq 1$.

When the gain g expressed by equation (4) exceeds the loss in a resonator, laser oscillation occurs in a quantum dot laser. When the loss of the resonator is maintained at a constant value by adopting the same structure, causing the probability $f_v$ that conduction electrons 5 occupy the ground level of the valence band to approach "0", that is, causing the probability that electrons are not present in the ground level of the valence band (the probability that holes 4 occupy the ground level of the valence band) to approach "1" is effective for lowering the probability $f_c$ that conduction electrons 5 occupy the ground level of the conduction band during laser oscillation.

Thus, to realize this result, holes 4 can be introduced into quantum dots 1 such that the ground level is occupied in advance by holes 4, whereby the probability $f_v$ that conduction electrons 5 occupy the ground level of the valence band of quantum dots 1 is decreased.

Further, in order to set the probability $f_v$ that conduction electrons occupy the ground level of the valence band to "0", the amount of holes 4 which are introduced into quantum dots 1 should be made equal to the number of states (density of states) of the ground level in quantum dots 1.

In a semiconductor laser of the prior art which uses a quantum well structure or bulk structure as the active layer, however, it is possible to lower the electron density during laser oscillation by appropriately setting the structure to inject holes into the active layer.

In a construction in which the conduction band extends continuously from the ground level toward higher energy, as in a semiconductor laser of the prior art, lowering the threshold electron density narrows the spread of energy which is held by the conduction electrons and narrows the spread of the gain energy, whereby the increase in the gain peak due to increase in the electrons which are injected becomes greater and the modulation speed of the laser output becomes higher. These points have already been reported by Uomi et al. [K. Uomi et al., Japanese *Journal of Applied Physics*, Vol. 29, No. 1, pp. 81-87, January 1990].

In the semiconductor laser provided with the quantum dots of the present embodiment, however, high-speed modulation is achieved by principles which are entirely different from those in the semiconductor laser which uses the above-described bulk structure as the active layer. Specifically, the quantization of quantum dots 1 in all three-dimensional directions results in discrete energy levels and an extremely narrow energy spread. As a result, the spread of the gain energy is uniform regardless of the amount of injected carriers, and the peak value of gain g of an active layer having a quantum dot structure varies linearly with respect to the electron density.

According to the above-described concepts relating to a semiconductor laser which uses a quantum well structure or bulk structure as the active layer, the modulation speed should be uniform and should not depend on the electron density. In the semiconductor laser provided with the quantum dots of the present embodiment, however, the ground level of the conduction band is filled by conduction electrons 5, and the time (relaxation time) required for the relaxation process of conduction electrons 5 which are in an excited level to the ground level is therefore greater.

Research by the present inventor confirmed that this lengthening of the relaxation time of conduction electrons 5 causes a drop in the modulation speed of a quantum dot laser. The introduction of holes 4 in advance into the ground level of the valence band in quantum dots 1 and the consequent reduction of the electron density of the ground level of the valence band of quantum dots 1 is effective for circumventing this problem.

Figure 5:
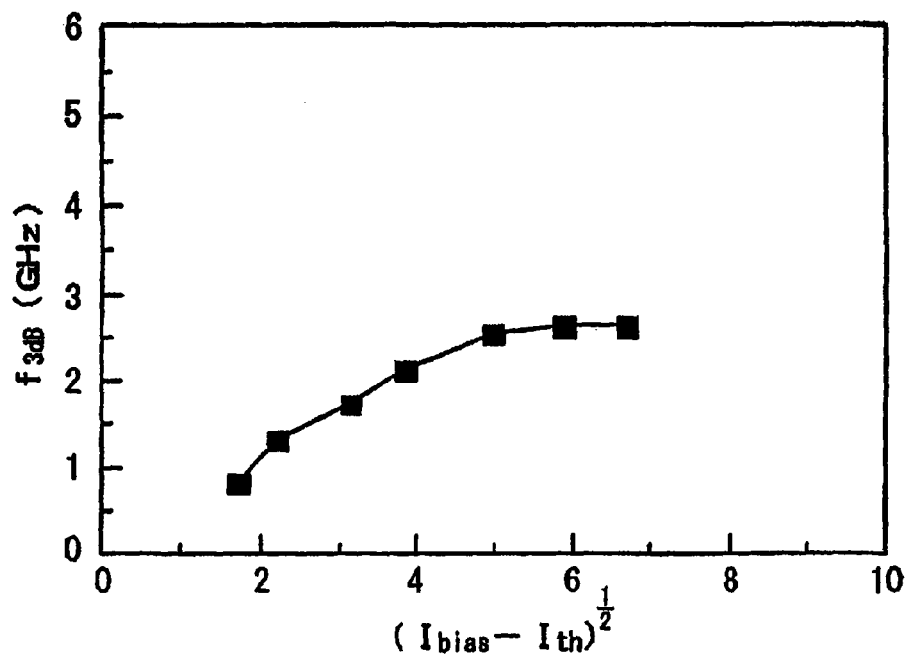
FIG. 5 is a graph showing the relation between the injected current and 3-dB modulation band $f_{3dB}$ in a quantum dot laser having an ordinary construction in which holes are not injected in advance into quantum dots.

FIG. 5 shows the relation between the injected current and 3-dB modulation band $f_{3dB}$ in a quantum dot laser having an ordinary construction in which holes 4 are not introduced into quantum dots 1. This graph plots 3-dB modulation band $f_{3dB}$ (a frequency range in which the response drops only 3 dB) for a case of fabricating a quantum dot laser having an ordinary construction in which holes 4 are not introduced into quantum dots 1 and then directly modulating this quantum dot laser by a small signal and measuring the frequency response characteristics. It should be noted that $I_{th}$ is the oscillation threshold current of this quantum dot laser.

As can be understood from FIG. 5, in a quantum dot laser in which holes 4 are not introduced into quantum dots 1, although 3-dB modulation band $f_{3dB}$ rises with increase in bias current $I_{bias}$, 3-dB modulation band $f_{3dB}$ has an upper limit of approximately 2.5 GHz.

Figure 6:
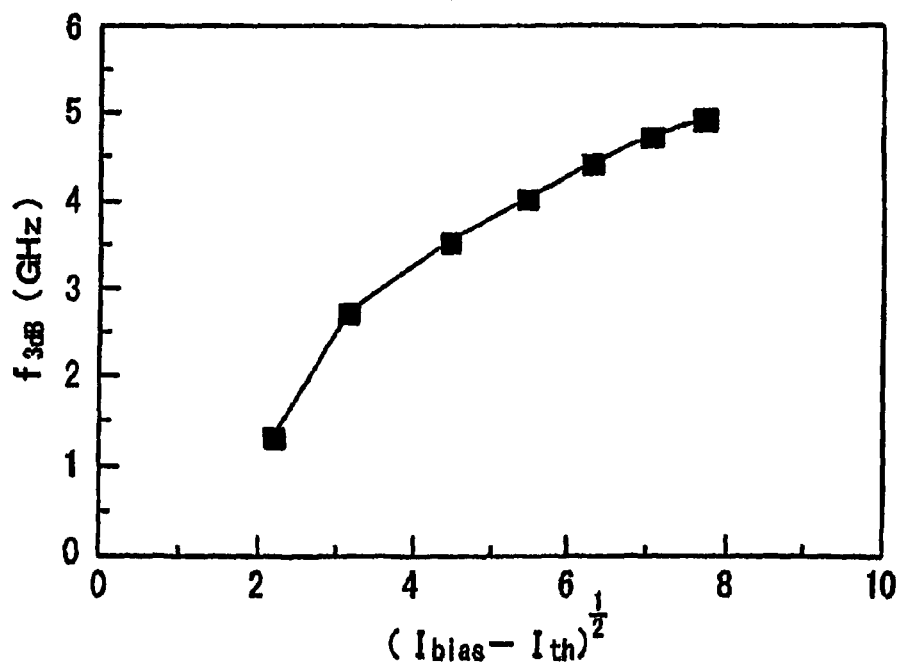
FIG. 6 is a graph showing the relation between the injected current and 3-dB modulation band $f_{3dB}$ in a quantum dot laser having the construction of the present invention in which holes are injected in advance into quantum dots.

In contrast, FIG. 6 shows the relation between injected current and 3-dB modulation band $f_{3dB}$ in a semiconductor laser provided with the quantum dots of the present embodiment in which holes 4 are introduced to quantum dots in advance. The graph of FIG. 6 was obtained by the same procedure as FIG. 5 with the exception of the introduction of holes 4 in quantum dots 1 in advance. In this quantum dot laser, the amount of doping of the p-type impurity in p-type semiconductor barrier layer (p-type impurity region) 3 was set to ten times the number of states of the ground level of the valence band of quantum dots 1. The ground level of this valence band is therefore completely filled by holes 4. In addition, the semiconductor laser having the characteristics of FIG. 6 is a construction having the same structure as the quantum dot laser of ordinary structure which was fabricated for measuring the characteristics of FIG. 5, with the exception of the provision of p-type semiconductor barrier layer (p-type impurity region) 3.

As can be clearly understood from FIG. 6, in the quantum dot laser according to the present embodiment in which holes 4 have been injected in advance into quantum dots 1, the upper limit of 3-dB modulation band $f_{3dB}$ is 5 GHz, which is twice the level (2.5 GHz) of the quantum dot laser of ordinary structure, and the frequency band is extended to twice that of the quantum dot laser of ordinary structure.

However, in the quantum dot laser which was fabricated for obtaining the results of FIG. 6, the upper limit of 3-dB modulation band $f_{3dB}$ does not reach 10 GHz. This problem is thought to be a consequence of setting the amount of doping of the p-type impurity in p-type semiconductor barrier layer (p-type impurity region) 3 to ten times the number of states of the ground level of the valence band of quantum dots 1, that is, doping which exceeds the amount of p-type impurity which is assumed to be necessary for filling the ground level of the valence band with holes 4. Essentially, this problem arises because excessive doping of holes 4 in the ground level of the valence band of quantum dots 1 leads to absorption loss, and thus leads to a slight increase in the oscillation threshold carrier density.

The amount of doping of p-type impurity in p-type semiconductor barrier layer (p-type impurity region) 3 is therefore preferably regulated such that the amount of doping equals the number of states of the ground level of the valence band of quantum dots 1, that is, such that holes 4 fill all of the number of states which can be obtained in the ground level of the valence band. In this way, a broad modulation band on the order of 10 GHz becomes possible and high-speed operation on the order of 10 GHz or greater can be realized.

As described in the foregoing explanation, decreasing the density of conduction electrons 5 of the ground level of quantum dots 1 in a quantum dot laser having the construction of the present embodiment enables an acceleration of the relaxation process of conduction electrons 5 from an excited level to the ground level of the conduction band of quantum dots 1. For example, if the probability $f_c$ that conduction electrons 5 occupy the ground level of the conduction band can be lowered to approximately 0.1, the relaxation time $\tau_{2-1}$ of conduction electrons 5 can be made approximately 10 ps. According to the above-described equation (2), it can be seen that 3-dB modulation band $f_{3dB}$ at this time surpasses 10 GHz.

Second Embodiment

FIG. 7A is a view showing the construction of the second embodiment of the semiconductor quantum dot device according to the present invention, and FIG. 7B is an energy band diagram of this quantum dot device.

The quantum dot device of the second embodiment is a construction in which quantum dots 1 are formed on undoped semiconductor barrier layer 3a, and p-type semiconductor barrier layer (p-type impurity region) 2a is formed on quantum dots 1. Holes 4 which are generated by the p-type impurity introduced into p-type semiconductor barrier layer 2a are introduced into quantum dots 1. In the quantum dot device according to this second embodiment as well, action and effects can be obtained that are equivalent to the action and effects of the first embodiment.

In addition, although examples were presented in above-described the first and second embodiments in which a p-type impurity is doped in a semiconductor barrier layer (p-type impurity region) which is disposed in the vicinity of quantum dots 1 and holes are introduced into the quantum dots from this semiconductor barrier layer, the holes may also be introduced into the quantum dots by directly doping the p-type impurity inside the quantum dots. According to experimentation by the present inventor, however, it was found that this type of composition suffers from the occurrence of flaws in the quantum dots and a drop in the emission efficiency.

EXAMPLES

Explanation next regards examples of the present invention with reference to the accompanying drawing.

First Example

Figure 8:
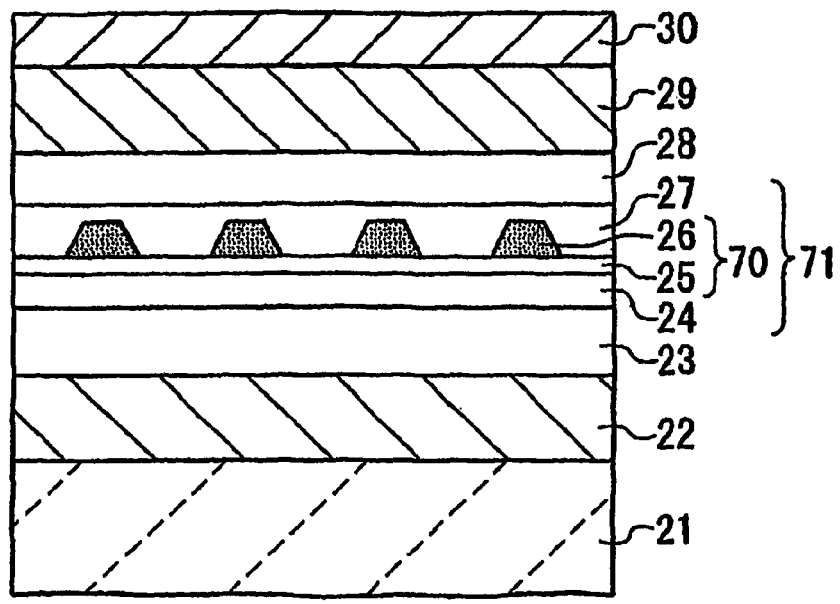
FIG. 8 is a sectional view showing the construction of the first example of a quantum dot laser in which the semiconductor quantum dot device of the present invention has been applied.

FIG. 8 shows the construction of a first example of a quantum dot laser in which the semiconductor quantum dot device of the present invention has been applied.

The quantum dot laser shown in FIG. 8 was fabricated by the following procedure which used an MBE (Molecular Beam Epitaxy) apparatus.

First, n-type AlGaAs cladding layer 22 (aluminum composition of 0.3, thickness of 3 μm, and carrier concentration of $1 \times 10^{18}$ cm$^{-3}$), undoped GaAs optical confinement layer 23 (thickness of 0.15 μm), and undoped GaAs barrier layer 24 (thickness of 20 nm) are successively grown on n-type GaAs substrate 21.

The temperature of GaAs substrate 21 is next set to 490° C. and InAs is grown on undoped GaAs barrier layer 24 while regulating the amount such that the InAs having a thickness equivalent to a three-atom layer is grown. At this time, undoped InAs quantum well layer (referred to as a "wetting layer") 25 is first formed to a thickness equivalent to one- or two-atom layer, following which InAs forms islands which exceed the critical film thickness of distortion while beryllium (Be), which is the p-type impurity, is simultaneously supplied. In this way, a plurality of p-type InAs quantum dots 26 which contain p-type impurity were formed on undoped InAs wetting layer 25.

The p-type InAs quantum dots which were thus obtained had a planar disc shape and a surface density of $5 \times 10^{10}$ cm$^{-2}$. In addition, each quantum dot had a diameter of 30 nm and a thickness (height) of 8 nm.

In the first example, beryllium, which is the p-type impurity, is supplied together with the InAs when growing the InAs quantum dots as described above, and the beryllium is doped inside the quantum dots while regulating the amount of this supply such that the surface density of the beryllium ($1 \times 10^{11}$ cm$^{-2}$) at this time is twice the surface density of quantum dots 1 ($5 \times 10^{10}$ cm$^{-2}$). Holes are thus introduced as carriers into each quantum dot, and these holes are at the ground level of the valence band of each quantum dot.

Next, using the same MBE apparatus, undoped GaAs barrier layer 27 (thickness of 20 nm), undoped GaAs optical confinement layer 28 (thickness of 0.15 μm), p-type AlGaAs cladding layer 29 (aluminum composition of 0.3, thickness of 2 μm, and carrier concentration of $5 \times 10^{17}$ cm$^{-3}$), and p-type AlGaAs cap layer 30 (aluminum composition of 0.15, thickness of 0.5 μm, and carrier concentration of $5 \times 10^{18}$ cm$^{-3}$) were successively grown on the quantum dot structure to obtain the quantum dot laser shown in FIG. 8.

As shown in FIG. 8, p-type InAs quantum dots 26 in the first example are covered by undoped GaAs barrier layer 27. In addition, quantum dot structure 70 is formed by undoped InAs quantum well layer (wetting layer) 25 and a plurality of p-type InAs quantum dots 26 formed over this undoped InAs quantum well layer 25. Further, quantum dot structure 70 and undoped GaAs barrier layers 24 and 27 which have been formed above and below this quantum dot structure 70 constitute active layer 71 of the quantum dot laser of the present example.

As previously described, in the quantum dot laser of the first example, beryllium (Be), which is a p-type impurity, is doped in the quantum dots to generate holes, and the ground level of the valence band of each quantum dot is filled by these holes.

The ground level of the valence band of each quantum dot is therefore not occupied by conduction electrons during laser oscillation, whereby the density of conduction electrons in the quantum dots drops and the relaxation process of conduction electrons from an excited level to the ground level of the conduction band of the quantum dots is accelerated.

In the first example, the relaxation rate of electrons was accelerated to approximately 10 ps. This means that the semiconductor laser of the first example is capable of high-speed modulation of 10 GHz or more.

Although GaAs substrate 21 was used in the present example, an InP substrate may be used instead. In such a case, cladding layers 22 and 29, optical confinement layers 23 and 28, and barrier layers 24 and 27 may be formed of InAlGaAs, or may be formed of InGaAsP. In this type of quantum dot laser, the emission wavelength from p-type InAs quantum dots 26 exceeds 1.3 μm, and this quantum dot laser is therefore well suited for use as a light source for use in long-wavelength optical communication.

Second Example

Figure 9:
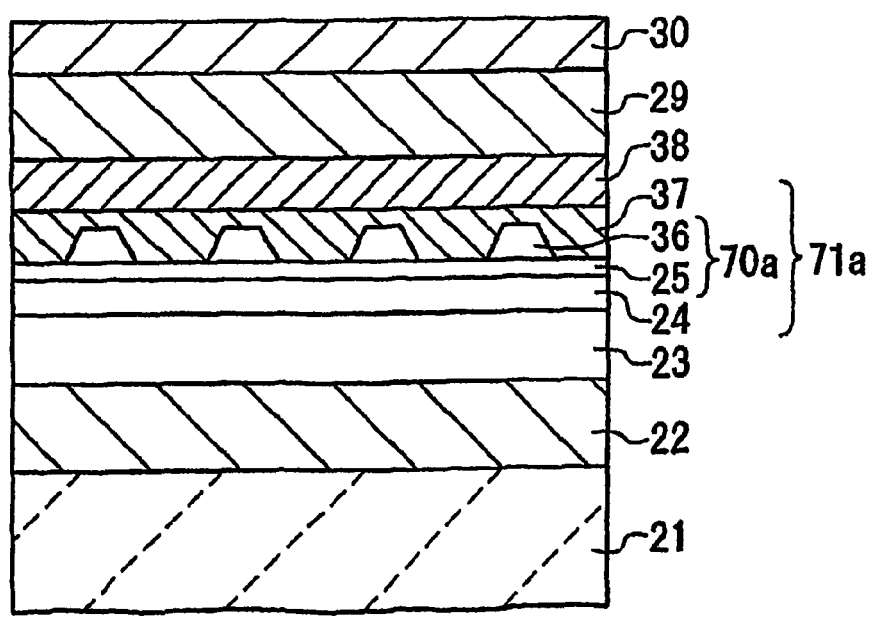
FIG. 9 is a sectional view showing the construction of the second example of a quantum dot laser in which the semiconductor quantum dot device of the present invention has been applied.

FIG. 9 shows the construction of the second example of a quantum dot laser in which the semiconductor quantum dot device of the present invention is applied.

The quantum dot laser of the second example is a construction in which undoped InAs quantum dots 36, p-type GaAs barrier layer 37, and p-type GaAs optical confinement layer 38 are formed in place of p-type InAs quantum dots 26, undoped GaAs barrier layer 27, and undoped GaAs optical confinement layer 28, respectively, in the first example. The construction is otherwise identical to that of the semiconductor laser of the first example, and constituent elements which are identical to elements in the first example are therefore identified by the same reference numbers and redundant detailed explanation is here omitted.

The quantum dot laser of the second example was fabricated by the following process using an MBE apparatus as in the first example.

As in the first example, n-type AlGaAs cladding layer 22, undoped GaAs optical confinement layer 23, undoped GaAs barrier layer 24, and undoped InAs wetting layer 25 are successively grown on n-type GaAs substrate 21.

A plurality of undoped InAs quantum dots 36 (diameter of 30 nm, thickness of 8 nm, and surface density of $5\times10^{10}$ cm$^{-2}$) are next formed on undoped InAs wetting layer 25. In the present example, in contrast with the first example, beryllium (Be) is not supplied during growth of InAs quantum dots 36.

In the present example, p-type GaAs barrier layer 37 (thickness of 20 nm) and p-type GaAs optical confinement layer 38 (thickness of 0.15 μm) are successively grown on undoped InAs quantum dots 36.

Finally, as in the first example, p-type AlGaAs cladding layer 29 and p-type AlGaAs cap layer 30 were grown on p-type GaAs optical confinement layer 38 to obtain the quantum dot laser shown in FIG. 9.

As shown in FIG. 9, undoped InAs quantum dots 36 of the second example are covered by p-type GaAs barrier layer 37. In addition, quantum dot structure 70a is formed by undoped InAs quantum well layer (wetting layer) 25 and the plurality of undoped InAs quantum dots 36 formed on this undoped InAs quantum well layer 25. Furthermore, quantum dot structure 70a and undoped GaAs barrier layers 24 and 27 formed above and below this quantum dot structure 70a constitute active layer 71a of the quantum dot laser of the present example.

Beryllium, which is the p-type impurity, is doped to a concentration of $6\times10^{15}$ cm$^{-3}$ in p-type GaAs barrier layer 37 and p-type GaAs optical confinement layer 38 which overlie undoped quantum dots 36, and these two layers therefore constitute p-type impurity regions.

In this construction, holes are generated with a surface density of $1\times10^{11}$ cm$^{-3}$ in p-type GaAs barrier layer 37 and p-type GaAs optical confinement layer 38 and flow into quantum dots 36. At this time, two holes are injected into each quantum dot, and these holes consequently fill the ground level of the valence band of each quantum dot.

As a result, in the quantum dot laser of the second example as well, the electron density of the ground level of the conduction band of quantum dots drops during laser oscillation, and the process of relaxation of conduction electrons from an excited level to the ground level of the conduction band is accelerated.

In the quantum dot laser of the second example, the relaxation time of conduction electrons from an excited level to the ground level of the conduction band of quantum dots can be accelerated up to the order of 10 ps, and high-speed modulation of 10 GHz or more can therefore be realized.

Although p-type impurity (Be) was directly doped into InAs quantum dots 26 in the first example, it was found that this type of construction was problematic due to the occurrence of flaws in the quantum dots and the consequent drop in emission efficiency, as described hereinabove. In the second example, rather than doping the p-type impurity (Be) into the quantum dots, the p-type impurity is doped in semiconductor layers 37 and 38 formed in the vicinity of quantum dots 36. Holes are then generated at a surface density of $1\times10^{11}$ cm$^{-2}$ in these two semiconductor layers 37 and 38, and these holes are caused to flow into quantum dots 36.

Thus, the second example not only obtains the same effects as the first example but also allows an improvement in modulation speed while suppressing decrease in the light emission efficiency of the quantum dots.

Third Example

Figure 10:
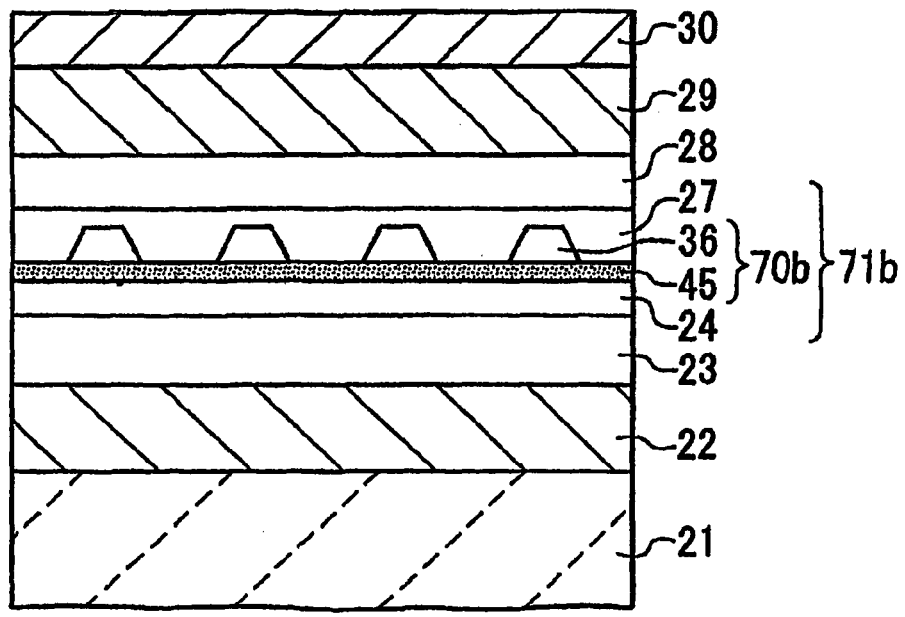
FIG. 10 is a sectional view showing the construction of the third example of a quantum dot laser in which the semiconductor quantum dot device of the present invention has been applied.

FIG. 10 shows the construction of the third example of a quantum dot laser in which the semiconductor quantum dot device of the present invention is applied.

The quantum dot laser of the third example is a construction in which p-type InAs wetting layer 45 is formed in place of undoped InAs wetting layer 25 which was shown in the first example, and undoped InAs quantum dots 36 which were shown in the second example are formed in place of p-type InAs quantum dots 26 which were shown in the first example. The construction is otherwise identical to the semiconductor laser of the first example, and constituent elements which are the same as elements in the first example are therefore identified by the same reference numerals and redundant detailed explanation is here omitted.

The quantum dot laser of the third example was fabricated by the following procedure using an MBE apparatus as in the first example and second example.

First, as in the first example, n-type AlGaAs cladding layer 22, undoped GaAs optical confinement layer 23, and undoped GaAs barrier layer 24 are first successively grown on n-type GaAs substrate 21.

InAs is then grown on undoped GaAs barrier layer 24 while supplying beryllium to form p-type InAs wetting layer 45 (thickness of 0.3 nm). A plurality of undoped InAs quantum dots 36 are next formed on this p-type InAs wetting layer 45 as in the second example, and undoped GaAs barrier layer 27 and undoped GaAs optical confinement layer 28 are successively grown on these undoped InAs quantum dots 36.

Finally, as in the first example, p-type AlGaAs cladding layer 29 and p-type AlGaAs cap layer 30 were successively formed on undoped GaAs optical confinement layer 28 to obtain the semiconductor laser shown in FIG. 10.

As shown in FIG. 10, undoped InAs quantum dots 36 of the third example are covered by undoped GaAs barrier layer 27. In addition, quantum dot structure 70b is formed by p-type InAs quantum well layer (wetting layer) 45 and the plurality of undoped InAs quantum dots 36 formed on this p-type InAs quantum well layer 45. Furthermore, quantum dot structure 70b and undoped GaAs barrier layers 24 and 27 formed above and below this quantum dot structure 70b constitute active layer 71b of the quantum dot laser of the present example.

If the energy band structure is considered in the semiconductor laser of the third example, the energy level of p-type InAs wetting layer (quantum well layer) 45 is lower than the energy levels of undoped GaAs barrier layer 27 and undoped GaAs optical confinement layer 28. In addition, the energy level of undoped InAs quantum dots 36 is lower than the energy level of p-type InAs wetting layer 45. The nature of conduction electrons is to flow from a region of high energy level to a region of low energy level, and the conduction electrons therefore flow from GaAs layers 27 and 28 to wetting layer 45, and from wetting layer 45 to quantum dots 36.

On the other hand, potential barriers against holes, these potential barriers being referred to as "spikes" or "notches," occur as a result of the discontinuity of the energy band at the hetero-junction interface of GaAs barrier layer 27 and InAs wetting layer 45. These potential barriers obstruct the movement of holes from GaAs barrier layer 27 to InAs wetting layer 45.

InAs wetting layer 45 is therefore preferable to GaAs barrier layer 27 as the p-type impurity region for injecting holes into InAs quantum dots 36 due to the more efficient injection of holes into InAs quantum dots 36.

In the quantum dot laser of the third example, p-type impurity is doped in InAs wetting layer 45, and GaAs barrier layer 27 is undoped. As a result, not only can the same effects as the first example be realized, but holes can also be efficiently introduced into InAs quantum dots 36 from p-type InAs wetting layer 45 without any obstruction of the transition of conduction electrons.

Fourth Example

Figure 11:
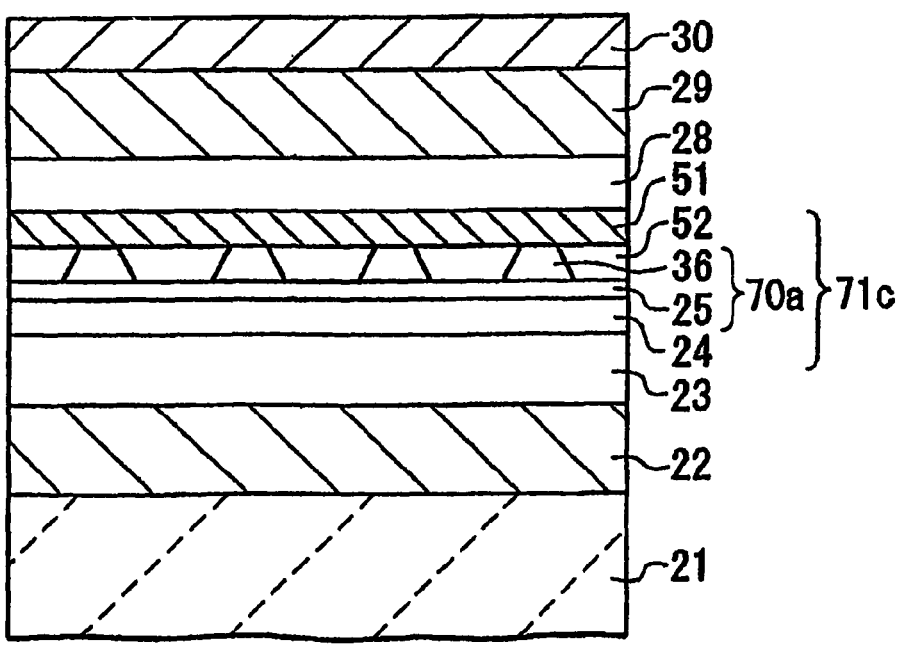
FIG. 11 is a sectional view showing the construction of the fourth example of a quantum dot laser in which the semiconductor quantum dot device of the present invention has been applied.

FIG. 11 shows the construction of the fourth example of the quantum dot laser in which the semiconductor quantum dot device of the present invention is applied.

The fourth example of the quantum dot laser is a construction in which undoped InAs quantum dots 36 which were shown in the second example are formed in place of p-type InAs quantum dots 26 which were shown in the first example, and in which p-type GaAs barrier layer 51 and undoped AlGaAs buried layer 52 are formed in place of undoped GaAs barrier layer 27 which was shown in the first example. The construction is otherwise the same as that of the semiconductor laser of the first example, and constituent elements which are identical to those of the first example are therefore identified by the same reference numerals and redundant detailed explanation is here omitted.

The semiconductor quantum dot laser of the present example was fabricated by the following procedure which uses an MBE apparatus.

First, as in the first example, n-type AlGaAs cladding layer 22, undoped GaAs optical confinement layer 23, undoped GaAs barrier layer 24, and undoped InAs wetting layer 25 were successively grown on n-type GaAs substrate 21.

Next, as in the second example, a plurality of undoped InAs quantum dots 36 were formed on undoped InAs wetting layer 25, and further, undoped AlGaAs buried layer 52 (thickness of 8 nm) was selectively formed on undoped InAs wetting layer 25 so as to bury the gaps between the quantum dots. At this time, the thickness of undoped AlGaAs buried layer 52 was equal to the height of quantum dots (8 nm).

Continuing, p-type GaAs barrier layer 51 (thickness of 20 nm, and carrier concentration of $5 \times 10^{16}$ cm$^{-3}$) was grown on the quantum dots and undoped AlGaAs buried layer 52, following which undoped GaAs optical confinement layer 28, p-type AlGaAs cladding layer 29, and p-type AlGaAs cap layer 30 were successively grown on this p-type GaAs barrier layer 51 as in the first example, whereby the semiconductor laser shown in FIG. 11 was obtained.

As shown in FIG. 11, undoped InAs quantum dots 36 of the fourth example are entirely covered by undoped AlGaAs buried layer 52 with the exception of the upper surfaces of undoped InAs quantum dots 36, and the upper surfaces of undoped InAs quantum dots 36 are covered by p-type GaAs barrier layer 51. Quantum dot structure 70a is formed by undoped InAs quantum well layer (wetting layer) 25 and the plurality of undoped InAs quantum dots 36 formed on this undoped InAs quantum well layer 25. Furthermore, quantum dot structure 70a together with underlying undoped GaAs barrier layer 24 and overlying p-type GaAs barrier layer 51, and undoped AlGaAs buried layer 52 constitute active layer 71c of the quantum dot laser of the present example.

In the quantum dot laser of the fourth example, AlGaAs buried layer 52, which has an energy level which is higher than GaAs, is buried at the side surfaces of undoped InAs quantum dots 36 as described in the foregoing explanation, and p-type GaAs barrier layer 51 is formed in contact with the upper surfaces of quantum dots 36. As a result, only the upper surfaces of InAs quantum dots 36 contact p-type GaAs barrier layer 51.

The flow path of carriers to undoped quantum dots 36 of quantum dot laser of the fourth example is next considered.

Carriers flow into undoped quantum dots 36 from below quantum dots 36 by way of undoped InAs wetting layer 25. The formation of undoped AlGaAs buried layer 52 at the side surfaces of quantum dots 36 prevents the flow of carriers into quantum dots 36 from these side surfaces. On the other hand, carrier flows in from above quantum dots 36 from p-type GaAs barrier layer 51 (which has a smaller band gap than AlGaAs buried layer 52) which contacts the upper surfaces of quantum dots 36. As a result, holes are introduced into quantum dots 36 directly from p-type GaAs barrier layer 51 and enter the ground level of the valence band.

In the semiconductor laser of the fourth example, conduction electrons injected from the outside enter undoped quantum dots 36 by way of undoped InAs wetting layer 25 during operation (during laser oscillation) and consequently undergo radiative recombination inside quantum dots 36 with holes which have been injected from outside the semiconductor laser. The conduction electrons injected from the outside do not recombine inside wetting layer 25 with holes which have been introduced in advance.

As a result, the semiconductor quantum dot laser of the present example not only provides the same effects as the first example but can also raise the efficiency of radiative recombination in quantum dots 36.

Fifth Example

Figure 12:
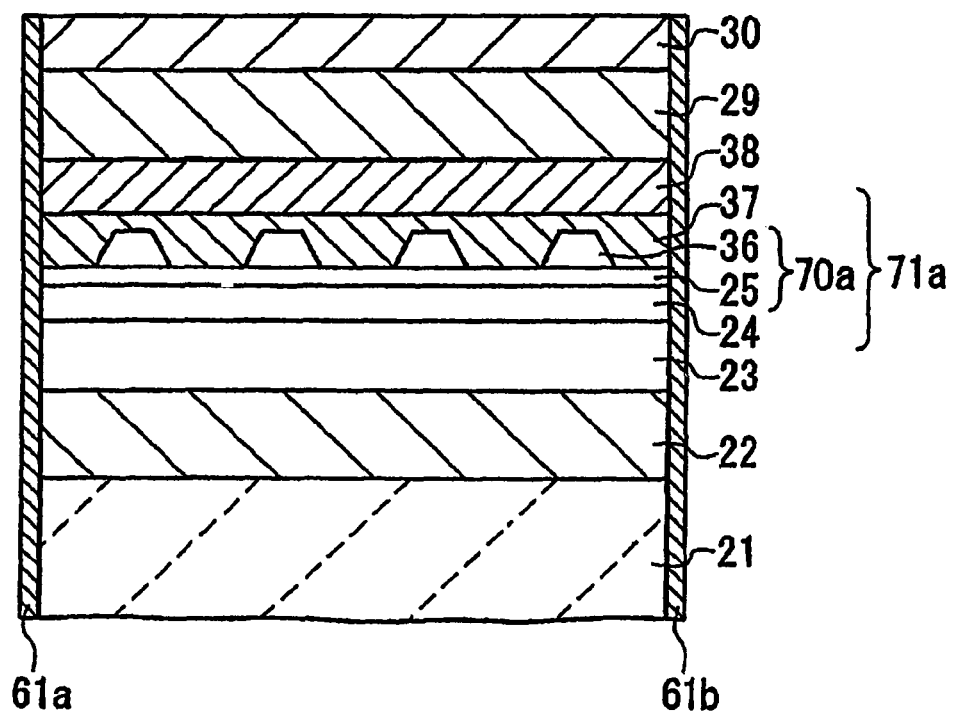
FIG. 12 is a sectional view showing the construction of the fifth example of a quantum dot laser in which the semiconductor quantum dot device of the present invention has been applied.

FIG. 12 shows the construction of an optical amplifier (quantum dot optical amplifier) in which the semiconductor quantum dot device of the present invention is applied.

The semiconductor optical amplifier of the present example is a construction in which a semiconductor layer is formed which has a laminated structure identical to the quantum dot laser of the second example shown in FIG. 9, and in which low-reflection films 61a and 61b are applied to and formed at both end surfaces of this semiconductor layer. The construction of the semiconductor layer is equivalent to that of the second example and redundant explanation is therefore here omitted.

As shown in FIG. 12, in the semiconductor optical amplifier of the present example, signal light introduced into the semiconductor optical amplifier by low-reflection films 61a and 61b which are formed at both end surfaces of the laminated structure (optical waveguide) is amplified by stimulated emission in active layer 71a having quantum dot structure 70a.

Gain in the ground level of quantum dots 36 which is lost by stimulated emission is recovered by the relaxation of conduction electrons and holes to the ground levels of the conduction band and valence band of quantum dots 36. Thus, as in the quantum dot laser of the second example, the injection of holes in advance in the ground level of the valence band of quantum dots 36 enables an acceleration of the process of relaxation of conduction electrons. As a result, optical amplification can be carried out that follows signal light which undergoes high-speed modulation in excess of 10 GHz.

[Modifications]

Although examples have been described in the above-described first to fourth examples in which the semiconductor quantum dot device of the present invention was applied to a semiconductor laser, the present invention is not limited to this form and can be applied to any other optical device that uses quantum dots.

Further, although an example was described in which the semiconductor quantum dot device of the present invention was applied to a semiconductor optical amplifier in the fifth example, the present invention is not limited to this form and can be applied in other optical devices such as semiconductor optical switches for implementing signal light switching and semiconductor wavelength conversion elements for converting the wavelength of signal light. Accordingly, the present invention can be applied to high-speed switching and wavelength conversion of signal light by the same construction and principles as the semiconductor optical amplifier.

Further, as devices that use quantum dots, applications are also possible to field effect transistors, single-electron control memories, or optical memories.

Although examples were described in the above-described first to fifth examples in which InAs was used for the wetting layer and quantum dots, the present invention is not limited to this form, and the wetting layer and quantum dots may employ semiconductors other than InAs. For example, InGaAs, GaInNAs, InGaP, and InGaN may also be used as the material that makes up the wetting layer and quantum dots.

What is claimed is:

1. A semiconductor quantum dot device that is provided with a plurality of quantum dots, comprising a p-type impurity arranged inside said quantum dots for generating holes, said holes filling a ground of a valence band of said quantum dots,
   wherein a concentration of said p-type impurity is a value which generates holes in said quantum dots in a number equal to or greater than a number of states which can exist in the ground level of the valence band of said quantum dots, and
   wherein a surface density of the p-type impurity which is contained in said quantum dots is greater than or equal to twice a surface density of said quantum dots, said surface density of the p-type impurity being greater than or equal to $1 \times 10^{11}$ cm$^{-2}$.

2. The semiconductor quantum dot device according to claim 1, wherein the concentration of said p-type impurity is a value for introducing, into said quantum dots, holes of a number which is equal to or greater than a number of states which can exist in the ground level of the valence band of said quantum dots.

3. The quantum dot device according to claim 2, wherein the surface density of p-type impurity contained in a p-type impurity region is greater than or equal to a surface density of said quantum dots.

4. The quantum dot device according to claim 3, wherein the surface density of the p-type impurity contained in a p-type impurity region is greater than or equal to twice the surface density of said quantum dots.

5. A quantum dot laser, comprising:
   an undoped wetting layer; and
   plural quantum dots associated with the undoped wetting layer, the plural quantum dots having a p-type impurity provided therein,
   wherein a concentration of said p-type impurity is a value which generates holes in said quantum dots in a number equal to or greater than a number of states which can exist in a ground level of the valence band of said quantum dots, a surface density of the p-type impurity being greater than or equal to $5 \times 10^{10}$ cm$^{-2}$, and
   wherein a surface density of the p-type impurity which is contained in said quantum dots is greater than or equal to twice a surface density of the quantum dots, the quantum dots configured to provide holes at the ground level of the valence band of each quantum dot.

6. The quantum dot laser of claim 5, further comprising an undoped barrier layer provided on the plural quantum dots and the undoped wetting layer.

7. The quantum dot laser of claim 5, wherein the ground level of the valence band of each of the plural quantum dots is configured to not be occupied by electrons during an oscillation of the quantum dot laser.

8. The quantum dot laser of claim 5, wherein beryllium is doped in the quantum dots to generate holes and the ground level of a valence band of each quantum dot is filled by these holes, and
   wherein the ground level of the valence band of each quantum dot is configured to not be occupied by conduction electrons during laser oscillation, whereby a density of conduction electrons in the quantum dots drops and a relaxation process of conduction electrons from an excited level to the ground level of the conduction band of the quantum dots is accelerated.

9. The quantum dot laser of claim 5, further comprising:
a substrate;
a barrier layer provided over the substrate and the plural quantum dots, the barrier layer having a p-type doping concentration of at least $6 \times 10^{15}$ cm$^{-3}$;
a first cladding layer provided over the substrate;
a first undoped optical confinement layer provided on the first cladding layer; and
a first barrier layer provided on the first undoped optical confinement layer,
wherein the undoped wetting layer is provided on the first barrier layer,
wherein the plural quantum dots are provided on the undoped wetting layer.

10. The quantum dot device according to claim 1, wherein said quantum dots have a height of approximately 8 nm.

11. The quantum dot device according to claim 1, wherein quantization of said quantum dots occurs in three-dimensional directions.

12. The quantum dot device according to claim 5, wherein said p-type impurity has a surface density of approximately $1 \times 10^{11}$ cm$^{-2}$.

13. The quantum dot device according to claim 1, wherein said p-type impurity comprises beryllium.

14. The quantum dot device according to claim 1, wherein holes are introduced into said quantum dots and said ground is occupied in advance by said holes.

15. The quantum dot device according to claim 14, wherein an amount of said holes being introduced into quantum dots is equal to a number of states of said ground.

* * * * *